(12) United States Patent
Halbritter

(10) Patent No.: US 9,519,051 B2
(45) Date of Patent: Dec. 13, 2016

(54) OPTOELECTRONIC DEVICE AND APPARATUS HAVING SUCH A DEVICE

(71) Applicant: OSRAM Opto Semiconductors GmbH, Regensburg (DE)

(72) Inventor: Hubert Halbritter, Dietfurt (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 88 days.

(21) Appl. No.: 14/405,750

(22) PCT Filed: Apr. 25, 2013

(86) PCT No.: PCT/EP2013/058643
§ 371 (c)(1),
(2) Date: Dec. 4, 2014

(87) PCT Pub. No.: WO2013/182351
PCT Pub. Date: Dec. 12, 2013

(65) Prior Publication Data
US 2015/0177366 A1 Jun. 25, 2015

(30) Foreign Application Priority Data
Jun. 6, 2012 (DE) .......... 10 2012 104 910

(51) Int. Cl.
*H01J 40/14* (2006.01)
*G01S 7/481* (2006.01)
(Continued)

(52) U.S. Cl.
CPC ............ *G01S 7/4813* (2013.01); *G01S 17/026* (2013.01); *G01S 17/08* (2013.01); *H01L 31/173* (2013.01);
(Continued)

(58) Field of Classification Search
CPC ........................... G01S 7/4813; H01L 31/167
(Continued)

(56) References Cited

U.S. PATENT DOCUMENTS 5,825,473 A 10/1998 Kodaira
8,711,334 B2 4/2014 Haas et al.
(Continued)

FOREIGN PATENT DOCUMENTS

CN 101785119 A 7/2010
CN 101936752 A 1/2011
(Continued)

OTHER PUBLICATIONS

Yatsuka, E. et al.; "Optical Design for the Edge Thomson Scattering System in ITER," The Japan Society of Plasma Science and Nuclear Fusion Research, 27th Annual Meeting, Dec. 2010, pp. 1-2.

*Primary Examiner* — Kevin Pyo
(74) *Attorney, Agent, or Firm* — Slater Matsil, LLP

(57) ABSTRACT

An optoelectronic device has a first component provided to generate radiation, a second component provided to receive radiation, a connection board and a frame. The first component and the second component are arranged on the connection board. The frame is arranged on the connection board. The first component is arranged in a first opening in the frame. The second component is arranged in a second opening in the frame. The first opening and the second opening extend from a main face of the frame opposite the connection board in the direction of the connection board. The main face between the first opening and the second opening has an intermediate region, in which a reflection of radiation incident on the main face is reduced.

20 Claims, 6 Drawing Sheets

(51) Int. Cl.
*H01L 31/173* (2006.01)
*H03K 17/94* (2006.01)
*H03K 17/96* (2006.01)
*G01S 17/02* (2006.01)
*G01S 17/08* (2006.01)

(52) U.S. Cl.
CPC ........ *H03K 17/941* (2013.01); *H03K 17/9631* (2013.01); *H03K 2217/94108* (2013.01)

(58) Field of Classification Search
USPC ............ 250/214.1, 338.1, 338.4; 257/81, 82, 257/E31.129
See application file for complete search history.

(56) References Cited

U.S. PATENT DOCUMENTS

| | | | |
|---|---|---|---|
| 8,779,361 | B2 | 7/2014 | Costello et al. |
| 2007/0090282 | A1* | 4/2007 | Chin .................. G01D 5/34715 250/231.13 |
| 2007/0170380 | A1* | 7/2007 | Tsuji ....................... G01V 8/10 250/559.32 |
| 2010/0181578 | A1 | 7/2010 | Li et al. |
| 2010/0230697 | A1 | 9/2010 | Kohler et al. |
| 2010/0258710 | A1 | 10/2010 | Wiese et al. |
| 2010/0327164 | A1 | 12/2010 | Costello et al. |
| 2011/0297831 | A1 | 12/2011 | Yao et al. |
| 2012/0129580 | A1 | 5/2012 | Tam |
| 2012/0133956 | A1 | 5/2012 | Findlay et al. |
| 2013/0292705 | A1 | 11/2013 | Makimura et al. |
| 2015/0301176 | A1* | 10/2015 | Halbritter ........... H01L 31/0203 250/216 |

FOREIGN PATENT DOCUMENTS

| | | |
|---|---|---|
| CN | 102364358 A | 2/2012 |
| CN | 102395859 A | 3/2012 |
| DE | 10214121 C1 | 12/2003 |
| DE | 102008029467 A1 | 12/2009 |
| DE | 102010030625 A1 | 1/2011 |
| EP | 0790654 A2 | 8/1997 |
| JP | 386643 A | 4/1996 |
| JP | 201149473 A | 3/2011 |
| JP | 2011525239 A | 9/2011 |
| WO | 2012098981 A1 | 7/2012 |

* cited by examiner

OPTOELECTRONIC DEVICE AND APPARATUS HAVING SUCH A DEVICE

This patent application is a national phase filing under section 371 of PCT/EP2013/058643, filed Apr. 25, 2013, which claims the priority of German patent application 102012104910.6, filed Jun. 6, 2012, each of which is incorporated herein by reference in its entirety.

TECHNICAL FIELD

The present application relates to an optoelectronic device and to an apparatus having such a device.

BACKGROUND

In the case of a proximity sensor that detects the radiation that is emitted by a radiation source and reflected at a target object, stray radiation, for example, at a radiation window behind which the proximity sensor is arranged in an apparatus, can lead to the corruption of the measurement result.

SUMMARY

Embodiments of the present application specify a simple optoelectronic device which can be produced cost-effectively and in which the influence of stray radiation is reduced.

In accordance with at least one embodiment of the optoelectronic device, the optoelectronic device comprises a first component provided for generating radiation. The first component can be embodied as a luminescence diode.

In accordance with at least one embodiment of the optoelectronic device, the optoelectronic device comprises a second component provided for receiving radiation, in particular radiation emitted by the first component during the operation of the device. The second component can be embodied, for example, as a photodiode or a phototransistor.

The first component and/or the second component can be embodied as an unpackaged semiconductor chip. That is to say that the component itself does not have a housing. A compact configuration of the device is thus simplified. Alternatively, the component can also be embodied as a component having a housing.

In accordance with at least one embodiment of the optoelectronic device, the optoelectronic device comprises a connection carrier. The first component and the second component can be arranged, and in particular fixed, on the connection carrier. In particular, the first component and/or the second component can be electrically conductively connected in each case to at least two connection areas of the connection carrier. The connection carrier can be embodied, for example, as a circuit board, for instance a printed circuit board (PCB), or as a metal-core circuit board. The connection carrier can terminate the optoelectronic device on the rear side, that is to say on an opposite side relative to a radiation passage surface of the optoelectronic device. As an alternative to a circuit board, the connection carrier can be embodied, for example, as a leadframe.

In accordance with at least one embodiment of the optoelectronic device, the latter is embodied as a surface mounted device (SMD). The connection carrier, for instance the circuit board, is part of the optoelectronic device, which can be arranged for mounting on a mounting carrier, for example, on a further circuit board, and can be electrically conductively connected thereto.

In accordance with at least one embodiment of the optoelectronic device, the connection carrier has contact areas for external electrical contact-making on the side facing away from the radiation passage surface. The contact areas can be electrically connected to the optoelectronic component, and if appropriate the further optoelectronic component, via plated-through holes through the connection carrier. Therefore, electrical contact can be made with the optoelectronic device externally from the rear side.

In accordance with at least one embodiment of the optoelectronic device, the optoelectronic device comprises a frame. The frame can have a first opening, in which the first component is arranged. The frame can furthermore have a second opening, in which the second component is arranged. The frame can be arranged on the connection carrier and can furthermore be fixed thereto, for example, by means of a fixing layer. In particular, the first opening and/or the second opening can extend completely around the first component and/or the second component in a lateral direction. A direct beam path between the first component and the second component is blocked by means of the frame.

In case of doubt, a lateral direction is understood to mean a direction running along a main extension plane of the connection carrier.

In accordance with at least one embodiment of the optoelectronic device, the frame has a main surface on the opposite side relative to the connection carrier. The first opening and/or the second opening extend from a main surface of the frame situated opposite the connection carrier in the direction of the connection carrier. The first opening and/or the second opening can extend completely through the frame.

In accordance with at least one embodiment of the optoelectronic device, the main surface has an intermediate region. The intermediate region is arranged between the first opening and the second opening. A reflection of radiation from the second component that impinges on the main surface is reduced in the intermediate region.

The optoelectronic device is preferably provided for operation with a radiation window. The radiation window is at a distance in particular from the main surface of the frame. The radiation window can be formed, for example, in an apparatus containing the optoelectronic device. During the operation of the device, the radiation generated by the first component is transmitted through the radiation window and impinges on the second component after reflection at a target object. The radiation window preferably runs parallel or substantially parallel to the main extension plane of the connection carrier.

In the context of the application, "substantially parallel" is understood to mean an included angle of at most 10°.

The intermediate region is used to reduce the radiation portion which, during the operation of the optoelectronic device, impinges on the main surface after a reflection at the radiation window and impinges on the second component after reflection at the main surface and a further reflection at the radiation window and generates an undesired stray signal at said second component. This undesirable stray radiation that impinges on the second component without passing through the radiation window is designated hereinafter as "internal stray radiation". In particular, the intermediate region is used to reduce that portion which impinges on the second component after only one reflection at the main surface of the frame in conjunction with a reflection before impinging on the main surface and a reflection after impinging on the main surface.

In accordance with at least one embodiment of the optoelectronic device, a structuring having at least one depression is formed in the intermediate region. The structuring is provided for reducing the radiation that impinges on the second component after single reflection at the main surface in conjunction with a reflection at the radiation window before the reflection and a further reflection at the radiation window after the reflection. The structuring can be formed in particular in such a way that the internal stray radiation is reduced compared with a configuration having a planar main surface between the first opening and the second opening. In particular, an increased proportion of the internal stray radiation has to impinge on the frame at least twice before said radiation is received by the second component.

As an alternative or in addition to the structuring, the reflection can be reduced by a purposefully absorbent configuration of the intermediate region. Purposefully absorbent means that at least 80%, preferably at least 90%, particularly preferably at least 95%, of radiation that is emitted by the first component and impinges in the intermediate region is absorbed. The frame can be produced from a purposefully absorbent material or coated with a purposefully absorbent material in the region of the intermediate region.

The depression is arranged at a distance from the first cavity and from the second cavity. The depression can extend through the frame completely or only regionally in the vertical direction, that is to say in a direction running perpendicular to a main extension plane of the connection carrier. In particular, the depression, in contrast to the openings, is not provided for receiving an optoelectronic component.

In accordance with at least one embodiment of the optoelectronic device, the structuring has a plurality of depressions. An elevation of the frame is formed between two adjacent depressions. The frame can also have more than one elevation. The at least one elevation can be embodied in particular in a web-shaped fashion. A main extension direction of the web-shaped elevation preferably extends transversely or perpendicularly with respect to a connecting line between the first component and the second component.

In accordance with at least one embodiment of the optoelectronic device, the web-shaped elevation is embodied as inclined toward the first component as viewed from the connection carrier in the direction of the main surface.

In accordance with at least one embodiment of the optoelectronic device, the web-shaped elevation tapers from the connection carrier in the direction of the main surface. A cross section of the web-shaped elevation therefore decreases with increasing distance from the connection carrier.

In accordance with at least one embodiment of the optoelectronic device, a plurality of web-shaped elevations are formed between the depressions. In a plan view of the main surface, a radius of curvature of a web-shaped elevation is preferably smaller than a radius of curvature of a web-shaped elevation that is further away from the first component. In particular, a plurality of elevations can be formed in such a way that the elevations have an increasingly larger radius of curvature with increasing distance from the first component.

In accordance with at least one embodiment of the optoelectronic device, the intermediate region has a surface region of the main surface that runs obliquely with respect to the connection carrier. In other words, in the intermediate region, the main surface runs obliquely with respect to the main extension plane of the connection carrier at least regionally.

In accordance with at least one embodiment of the optoelectronic device, the intermediate region has a ridge line running parallel or substantially parallel to, thus at an included angle of at most 10° with respect to, a connecting line between the first component and the second component. The surface region runs obliquely with respect to the connection carrier in a transverse direction running perpendicular to the ridge line. The surface region therefore has a roof-shaped basic shape in a sectional view running in the transverse direction. In particular, on both sides of the ridge line a distance between the intermediate region and the connection carrier can decrease with increasing distance from the ridge line.

In accordance with at least one embodiment of the optoelectronic device, the optoelectronic device is embodied as a proximity sensor.

The optoelectronic device is suitable in particular for use in an apparatus, for example, a handheld apparatus, for instance a handheld appliance, for example, for communication. The apparatus can be a cellular phone, for example.

In accordance with at least one embodiment of the apparatus, the latter comprises the optoelectronic device and a radiation window. The second optoelectronic component is provided for receiving radiation that is emitted by the first optoelectronic component through the radiation window and is reflected at a target object. The radiation window can be provided in particular in a housing of the apparatus.

In accordance with at least one embodiment of the device, the structuring is formed in such a way that radiation that is emitted by the first component and is reflected at the radiation window, upon first impinging on the intermediate region, is deflected predominantly, that is to say in a proportion of at least 51%, away from the second component. As viewed from the respective impingement point, the reflected radiation therefore radiates predominantly into a half-space facing toward the first component.

In accordance with at least one embodiment of the device, the structuring is formed in such a way that radiation that is emitted by the first component and reflected at the radiation window, upon first impinging on the intermediate region, is directed predominantly away from a plane running through a connecting line between the first optoelectronic component and the second optoelectronic component and perpendicular to the connection carrier.

BRIEF DESCRIPTION OF THE DRAWINGS

Further features, advantageous configurations and expediencies of the invention will become apparent from the following description of the exemplary embodiments in conjunction with the figures.

In the figures.

Elements that are identical, of identical type or act identically are provided with identical reference signs in the figures.

The figures are in each case schematic illustrations and therefore not necessarily true to scale. Rather, comparatively small elements and in particular layer thicknesses may be illustrated with an exaggerated size for the sake of clarification.

DETAILED DESCRIPTION OF ILLUSTRATIVE EMBODIMENTS

Figure 1:
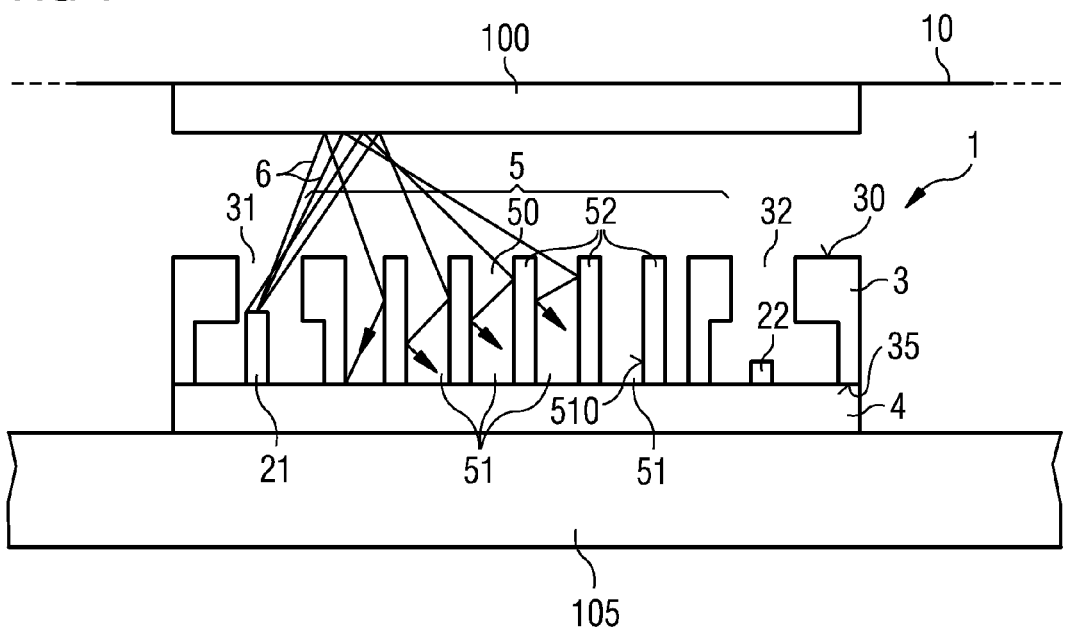
FIG. 1 shows a first exemplary embodiment of an apparatus comprising an optoelectronic device in schematic sectional view.

FIG. 1 shows an exemplary embodiment of an apparatus 10 comprising an optoelectronic device 1. The apparatus can be, for example, a handheld appliance for communication, for instance a cellular phone.

The apparatus 10 comprises a radiation window 100, behind which the optoelectronic device 1 is arranged. The optoelectronic device comprises a first component 21 provided for generating radiation and a second component 22 provided for receiving radiation from the first component. The first component and the second component therefore form an emitter-detector pair.

The first component 21 and the second component 22 are arranged on a connection carrier 4. The connection carrier can be, for example, a circuit board, for instance a printed circuit board (PCB). For making electrical contact with the first component 21 and the second component 22, the connection carrier has connection areas on the side facing the components (not explicitly illustrated in FIG. 1).

Preferably, the optoelectronic device 1 is embodied as a surface mounted device. For externally making electrical contact with the optoelectronic device, electrical contacts can be formed on a side of the connection carrier 4 which faces away from the components 21, 22 (not explicitly shown in FIG. 1, for the sake of simplified illustration). The electrical contacts are electrically conductively connected to a mounting carrier 105, for example, a further circuit board.

The first component 21 is preferably embodied as a luminescence diode, in particular as a light emitting diode. The component preferably emits radiation in the near infrared range (NIR; vacuum wavelength 750 nm-1400 nm), particularly preferably in the wavelength range of between 800 nm and 1000 nm inclusive.

The second component 22 is preferably embodied as a photodiode or as a phototransistor. A photosensitive integrated circuit, for example, a specially embodied application-specific integrated circuit (ASIC), can also be employed.

The second component 22 is preferably based on silicon. In a departure therefrom, the second component can also be based on a different semiconductor material, for example, a III-V compound semiconductor material.

The first component 21 and/or the second component 22 can be embodied in each case as an unpackaged semiconductor chip. A particularly compact configuration of the optoelectronic device 1 is simplified as a result. Alternatively, the first component and/or the second component can comprise a housing with a semiconductor chip.

A frame 3 is arranged on the connection carrier 4 and is preferably connected stably thereto, for example, by means of a connecting layer, for instance an adhesive layer. The frame is preferably produced from a plastic, for example, by means of injection molding or transfer molding. In a lateral direction, that is to say in a direction running along a main extension plane of the connection carrier 4, the frame 3 and the connection carrier 4 terminate flush with one another at least regionally, preferably along the entire circumference of the device. During the production of the optoelectronic device 1, the frame 3 and the connection carrier 4 can thus be severed in a simplified manner in a common singulation step.

In a vertical direction, that is to say a direction running perpendicular to the main extension plane of the connection carrier 4, the frame extends between a main surface 30 facing away from the connection carrier and a rear side 35 facing the connection carrier.

A first opening 31 and a second opening 32 are formed in the main surface 30. The first component 21 is formed in the first opening and the second component 22 is formed in the second opening 32. The openings are at a distance from one another in the lateral direction.

The boundaries of the openings 31, 32 preferably in each case form apertures for the first component 21 and the second component 22, respectively. That is to say that a radiation cone that is emitted by the first component or received by the second component directly, that is to say without a reflection at a side surface of the openings, is determined by the first opening or the second opening, respectively. In this case, the term "cone" does not imply any restriction with regard to the cross section of the openings.

Between the first opening 31 and the second opening 32, the main surface 30 has an intermediate region 5. The intermediate region 5 is formed in such a way that radiation that is emitted by the first component 21 and is reflected at the radiation window 100 is deflected in such a way that said radiation cannot impinge on the second component without a further reflection at the frame 3. The proportion of internal stray radiation, illustrated by rays 6 in FIG. 1, which impinges on the second component 22 and brings about an undesirable signal portion there is thus reduced.

In the exemplary embodiment shown, the intermediate region 5 has a structuring 50 having a plurality of depressions 51. The depressions extend completely through the frame 3 in the vertical direction. The depressions are arranged alongside one another along a connecting line between the first component and the second component. A respective elevation 52 is formed between two adjacent depressions. The elevations are preferably embodied in a web-shaped fashion in a plan view of the device 1, wherein a main extension direction of the elevations extends obliquely or perpendicularly with respect to the connecting line. Therefore, the internal stray radiation 6 does not impinge on a planar main surface of the frame 3, but rather is reflected at side surfaces 510 and a predominant proportion of said radiation impinges on an opposite side surface.

As an alternative or in addition to the structuring, the intermediate region 5 can also comprise a purposefully absorbent material. In particular, the frame 3 can be formed, in the intermediate region 5 or completely, from a material which purposefully absorbs the radiation generated by the first component 21. Alternatively, a coating composed of purposefully absorbent material can also be provided in the intermediate region.

Figure 2A:
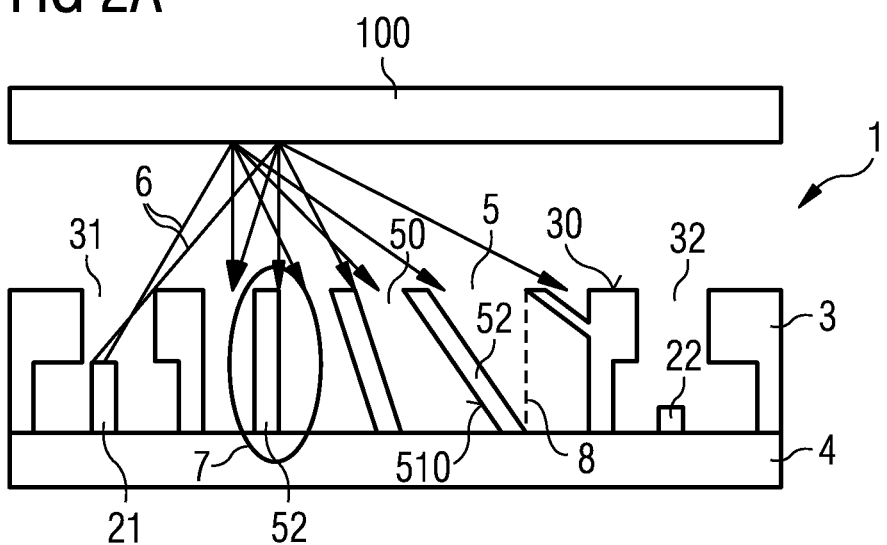
FIGS. 2A and 2B show an exemplary embodiment of an optoelectronic device in FIG. 2A and various configurations for elevations of the frame of the optoelectronic device in accordance with FIG. 2A in FIG. 2B.

The second exemplary embodiment illustrated in FIG. 2A substantially corresponds to the first exemplary embodiment described in association with FIG. 1. In contrast thereto, the frame 3 has in the intermediate region 5 elevations 52 that are inclined toward the first component 21 as viewed from the connection carrier 4 in the direction of the main surface.

In the exemplary embodiment shown, the inclination of the elevations 52 increases with increasing distance from the first component 21. As a result, the proportion of the internal stray radiation which does not impinge on the main surface 30, but rather on a side surface 510, can be reduced to a greater extent. Preferably, the elevations 52 are at a distance from one another in such a way that the elevations 52 adjoin one another or overlap one another in a plan view of the frame 3. This is illustrated schematically by a dashed line 8. The proportion of the radiation impinging on the side surfaces 510 is thus increased to a greater extent. In a departure therefrom, a plurality of elevations or else all of the elevations can have the same inclination.

Figure 2B:
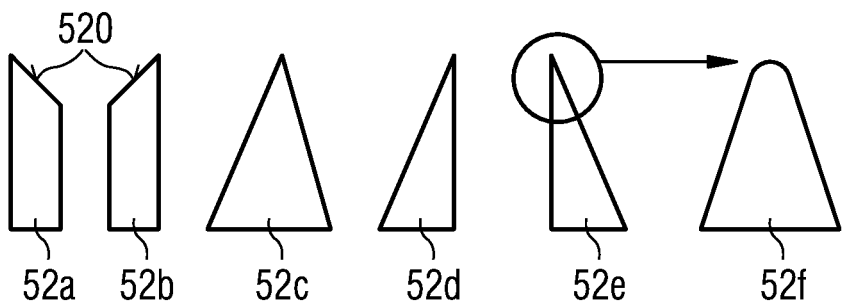

FIG. 2B shows various configurations of an excerpt 7 from the elevations 52 that is illustrated in FIG. 2A. The proportion of that surface of the frame 3 which runs parallel to the main surface 30 is minimized with all the configurations shown.

The elevations 52a, 52b have a cross section having a quadrilateral basic shape, wherein a top side 520 is inclined relative to the main surface 30. The top side 520 of the elevation 52a faces toward the second component 22. The proportion of the internal stray radiation which impinges on the top side 520 is minimized with this configuration. In the case of the elevation 52b, the top side 520 faces toward the first component 21. This has the effect that reflected radiation is reflected away from the second component 22, as a result of which a reduction of the stray radiation impinging on the second component can likewise be obtained.

The elevations 52c, 52d and 52e in each case have a triangular basic shape in cross section, wherein the elevations 52d, 52e each have the basic shape of a right-angled triangle.

As illustrated with reference to the elevation 52f, the top-side edges of the elevations 52 can also be embodied in a rounded fashion. This concerns, in particular, all configurations of the elevations 52a to 52e.

Figure 3:
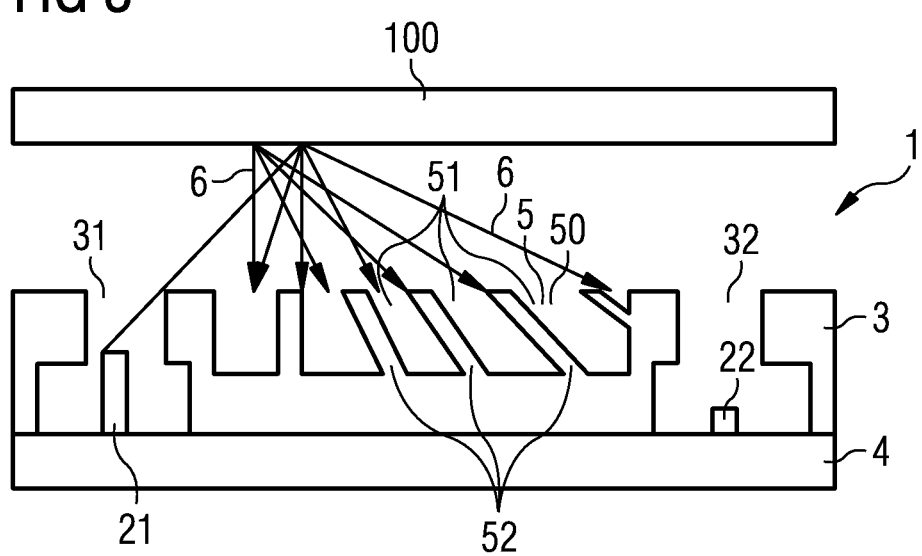
FIG. 3 shows a third exemplary embodiment of an optoelectronic device in schematic sectional view.

The third exemplary embodiment illustrated in FIG. 3 substantially corresponds to the second exemplary embodiment described in association with FIG. 2A. In contrast thereto, the depressions 51 do not extend completely through the frame 3 in a vertical direction. In the case of such a configuration, the frame can have an increased stability in the intermediate region 5. Furthermore, in a plan view of the device 1, the connection carrier 4 is completely covered in the intermediate region 5 and therefore not visible. It goes without saying that such a configuration of the depressions 51 is also applicable to the first exemplary embodiment described in association with FIG. 1.

Figure 4A:
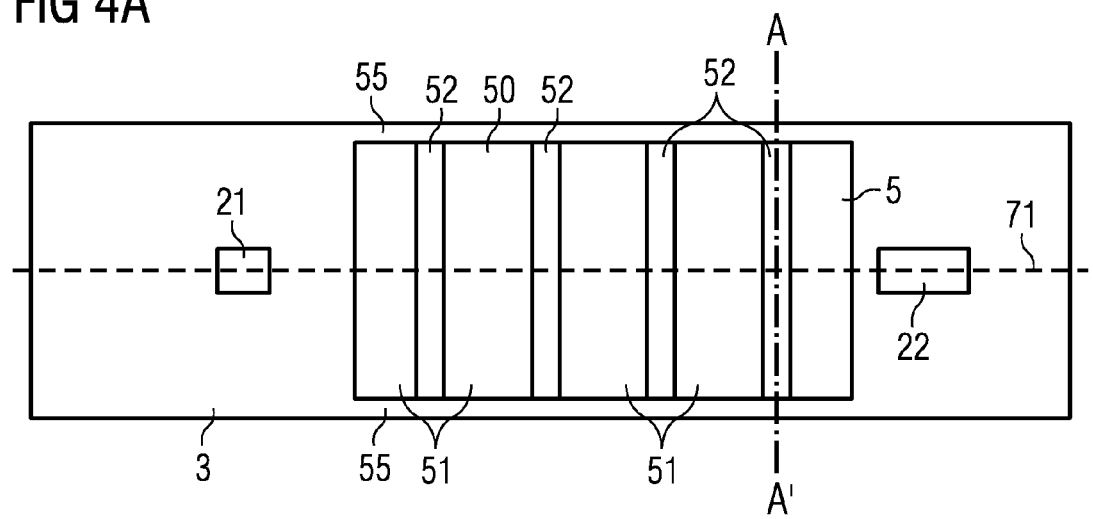
FIGS. 4A and 4B show a fourth exemplary embodiment of an optoelectronic device in plan view (FIG. 4A) and schematic sectional view (FIG. 4B)

FIG. 4A shows a fourth exemplary embodiment of an optoelectronic device 1 in plan view, wherein the exemplary embodiment substantially corresponds to the first exemplary embodiment described in association with FIG. 1. The elevations 52 in the intermediate region 5 of the frame 3 have a ladder-like structure in which the web-shaped elevations are formed between two connecting webs 55 that connect the elevations to one another. The main extension directions of the elevations 52 run parallel or at least substantially parallel to one another in plan view. Furthermore, in plan view the elevations 52 run obliquely or perpendicularly with respect to a connecting line 71 between the first component 21 and the second component 22. The connecting webs 55 run parallel or substantially parallel to the connecting line 71.

Figure 4B:
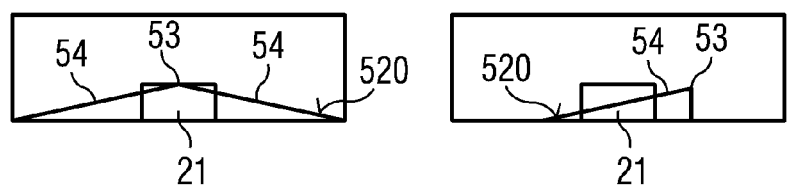

FIG. 4B shows two different variants for the configuration of the elevations 52 in sectional view along the line AA' illustrated in FIG. 4A. The top side 520 of the elevations 52 in each case has a ridge line 53 running parallel or substantially parallel to the connecting line 71. In the case of the variant illustrated on the left, the ridge line runs centrally, such that the top side 520 on both sides of the ridge line in each case has a surface region 54 running obliquely. In the case of the variant illustrated on the right, the ridge line is formed at an edge region of the elevations 53, such that the top side has only one surface region 54 running obliquely. An angle between the obliquely running surface region and the main extension plane of the connection carrier 4 is preferably between 5° and 70° inclusive.

By virtue of the obliquely running surface region 54 or the obliquely running surface regions 54, the risk that radiation will be reflected in the intermediate region 5 at a plane running in the main surface 30 and will impinge on the second component 22 after only one further reflection at the radiation window 100 is reduced to a greater extent.

Figure 5:
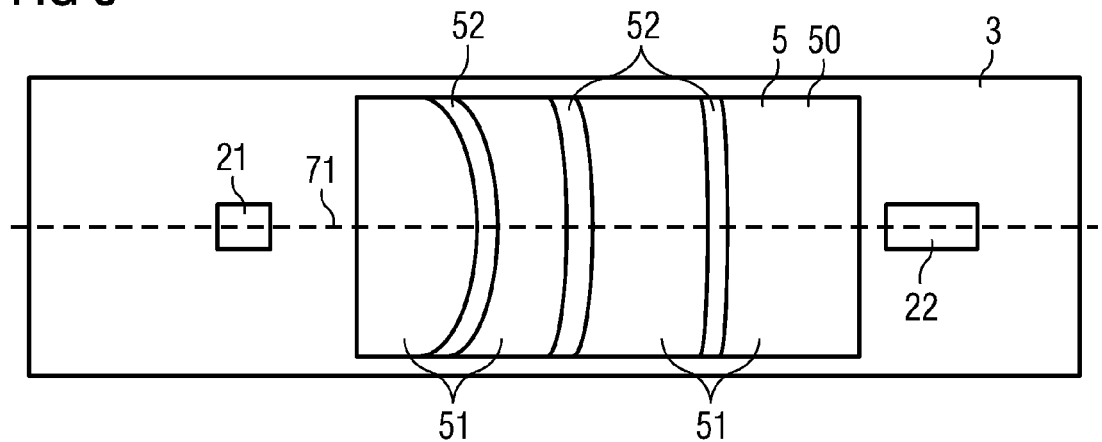
FIG. 5 shows a fifth exemplary embodiment of an optoelectronic device in schematic plan view.

The fifth exemplary embodiment illustrated in FIG. 5 substantially corresponds to the fourth exemplary embodiment described in association with FIG. 4. In contrast thereto, the elevations 52 are embodied as regionally curved in a plan view of the frame 3. The radius of curvature of the elevations 52 increases with increasing distance from the first component 21. It goes without saying that not all the elevations 52 need be embodied as curved. In the exemplary embodiment shown, the elevations 52 are embodied in each case as concavely curved as viewed from the first component 21. The influence of internal stray radiation can thus be reduced to a greater extent.

Figure 6:
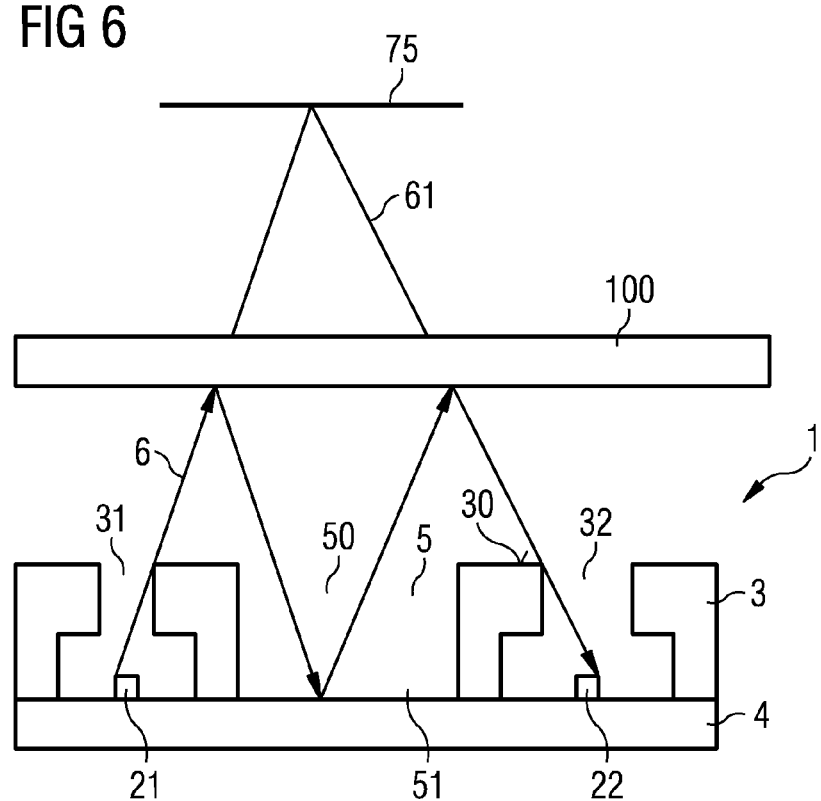
FIG. 6 shows a sixth exemplary embodiment of an optoelectronic device in schematic sectional view.

The exemplary embodiment illustrated in FIG. 6 substantially corresponds to the first exemplary embodiment described in association with FIG. 1. In contrast thereto, the intermediate region 5 has only one depression 51. In comparison with a configuration of the frame 3 having a main surface 30 running in a continuously planar fashion between the first opening 31 and the second opening 32, the proportion of the internal stray radiation which impinges on the second component 22 is reduced by virtue of the optical path of the stray radiation being lengthened. This leads to a reduction of the signal portion of the second component 22 that is caused by the internal stray radiation.

FIG. 6 furthermore schematically illustrates a beam course of a target radiation 61 reflected at a target object 75.

Figure 7A:
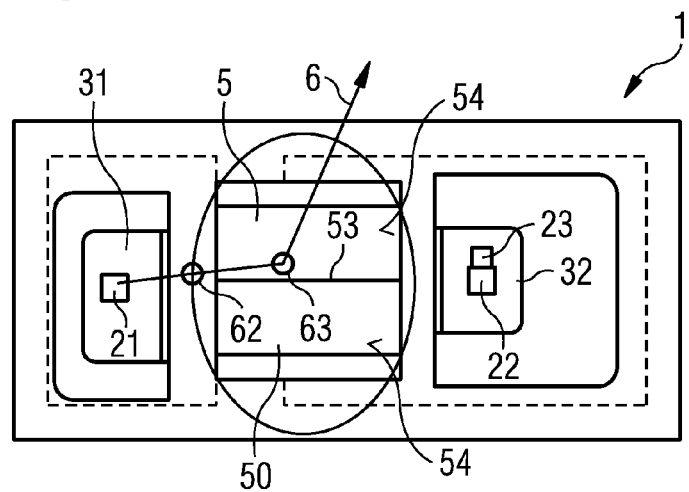
FIGS. 7A to 7C show a seventh exemplary embodiment of an optoelectronic device in schematic plan view (FIG. 7A) with the associated sectional views in the longitudinal direction (FIG. 7B) and the transverse direction (FIG. 7C).
Figure 7B:
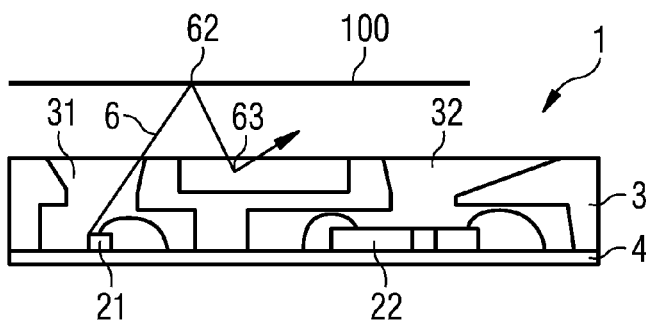
Figure 7C:
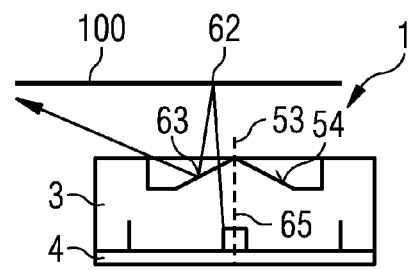

The seventh exemplary embodiment illustrated in FIGS. 7A to 7C substantially corresponds to the first exemplary embodiment described in association with FIG. 1. In contrast thereto, the intermediate region 5 is free of elevations 52 formed between depressions. The frame 3 has at least one obliquely running surface region 54 in the intermediate region 5. By way of example, the intermediate region 5, as shown in the sectional view illustrated in FIG. 7C, can have a roof-shaped basic shape. A ridge line 53 preferably runs parallel or substantially parallel to a connecting line between the first component 21 and the second component 22 (see, e.g., FIG. 4A).

In FIG. 7A, a further component 23 provided for receiving radiation is furthermore arranged in the second opening 32. This further component can have, in particular, a different spectral sensitivity distribution than the second component and can detect the ambient light, for example. It goes without saying that such a further component 23 can also be employed in the further exemplary embodiments described above.

Therefore, the optoelectronic device 1 can fulfill both the function of a proximity sensor and the function of an ambient light sensor.

The function of the intermediate region 5 is shown on the basis of a beam 6. The radiation emitted by the first component 21 is reflected at a first impingement point 62 at the radiation window 100 diffusely and/or directionally in the direction of the device. This reflected radiation impinges, at a second impingement point 63, on the intermediate region 5 of the frame 3 and is directed away there on account of the inclination of the inclined region 54 from a plane 65 running through the connecting line between the first component 21 and the second component 22 and perpendicular to the connection carrier 4, such that the radiation can no longer impinge on the second component 22 or can impinge thereon at least only in a greatly reduced proportion.

It goes without saying that the ridge line 53 can also be configured in the manner as described in association with FIG. 4B such that only one inclined region 54 is formed.

With the described configurations of the intermediate region 5 of the frame 3, what can be achieved in a simple and effective manner is that the signal portion of the second component 22 that is caused by internal stray radiation is significantly reduced, in particular compared with a planar configuration—which does not reduce the reflectivity—of the main surface 30 between the openings 31, 32.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. An optoelectronic device comprising:
   a connection carrier;
   a frame arranged on the connection carrier;
   a first component arranged on the connection carrier in a first opening of the frame, the first component provided for generating radiation arranged on the connection carrier; and
   a second component arranged on the connection carrier in a second opening of the frame, the second component provided for receiving radiation;
   wherein the first opening and the second opening extend from a main surface of the frame located opposite the connection carrier in a direction of the connection carrier; and
   wherein the main surface has an intermediate region between the first opening and the second opening, wherein a reflection of radiation impinging on the main surface is reduced in the intermediate region, and wherein the intermediate region includes a structuring having a depression.

2. The device according to claim 1, wherein the structuring has a plurality of depressions and wherein a web-shaped elevation of the frame is formed between two adjacent depressions.

3. The device according to claim 2, wherein the web-shaped elevation is inclined toward the first component as viewed from the connection carrier in the direction of the main surface.

4. The device according to claim 2, wherein the web-shaped elevation tapers from the connection carrier in the direction of the main surface.

5. The device according to claim 2, wherein a plurality of web-shaped elevations are formed between the depressions and, in a plan view of the main surface, a radius of curvature of a web-shaped elevation is smaller than a radius of curvature of a web-shaped elevation that is further away from the first component.

6. An optoelectronic device comprising:
   a connection carrier;
   a frame arranged on the connection carrier;
   a first component arranged on the connection carrier in a first opening of the frame, the first component provided for generating radiation arranged on the connection carrier; and
   a second component arranged on the connection carrier in a second opening of the frame, the second component provided for receiving radiation;
   wherein the first opening and the second opening extend from a main surface of the frame located opposite the connection carrier in a direction of the connection carrier; and
   wherein the main surface has an intermediate region between the first opening and the second opening, wherein a reflection of radiation impinging on the main surface is reduced in the intermediate region, and wherein the intermediate region has a surface region of the main surface that runs obliquely with respect to the connection carrier.

7. The device according to claim 6, wherein the intermediate region has a ridge line running parallel or substantially parallel to a connecting line between the first component and the second component, wherein the surface region runs obliquely with respect to the connection carrier in a transverse direction running perpendicular to the ridge line.

8. The device according to claim 7, wherein, on both sides of the ridge line, a distance between the intermediate region and the connection carrier decreases with increasing distance from the ridge line.

9. The device according to claim 1, wherein the optoelectronic device is embodied as a proximity sensor.

10. The device according to claim 1, wherein the optoelectronic device is embodied as a surface mounted device.

11. The device according to claim 1, wherein the device is provided for operation in an apparatus having a radiation window and the second component is provided for receiving a radiation that is emitted by the first component through the radiation window and is reflected at a target object.

12. The device according to claim 11, wherein the intermediate region has a structuring formed in such a way that radiation that is emitted by the first component and reflected at the radiation window, upon first impinging on the intermediate region, is deflected predominantly toward the first component.

13. The device according to claim 11, wherein the intermediate region has a structuring formed in such a way that radiation that is emitted by the first component and reflected at the radiation window, upon first impinging on the intermediate region, is directed predominantly away from a plane running through a connecting line between the first component and the second component and perpendicular to the connection carrier.

14. An apparatus comprising a radiation window and a device according to claim 1, wherein the second component is provided for receiving a radiation that is emitted by the first component through the radiation window and is reflected at a target object.

15. An optoelectronic device comprising:
   a connection carrier;
   a frame arranged on the connection carrier;

a first component arranged on the connection carrier in a first opening of the frame, the first component provided for generating radiation arranged on the connection carrier;

a second component arranged on the connection carrier in a second opening of the frame, the second component provided for receiving radiation; and wherein the first opening and the second opening extend from a main surface of the frame located opposite the connection carrier in a direction of the connection carrier;

wherein the main surface has an intermediate region between the first opening and the second opening; and wherein the intermediate region has a structuring having a depression or a surface region of the main surface that runs obliquely with respect to the connection carrier.

16. The device according to claim 6, wherein the optoelectronic device is embodied as a surface mounted device.

17. The device according to claim 6, wherein the device is provided for operation in an apparatus having a radiation window and the second component is provided for receiving a radiation that is emitted by the first component through the radiation window and is reflected at a target object.

18. The device according to claim 17, wherein the intermediate region has a structuring formed in such a way that radiation that is emitted by the first component and reflected at the radiation window, upon first impinging on the intermediate region, is deflected predominantly toward the first component.

19. The device according to claim 17, wherein the intermediate region has a structuring formed in such a way that radiation that is emitted by the first component and reflected at the radiation window, upon first impinging on the intermediate region, is directed predominantly away from a plane running through a connecting line between the first component and the second component and perpendicular to the connection carrier.

20. An apparatus comprising a radiation window and a device according to claim 6, wherein the second component is provided for receiving a radiation that is emitted by the first component through the radiation window and is reflected at a target object.

* * * * *